United States Patent
Chen

(10) Patent No.: US 9,293,471 B1
(45) Date of Patent: Mar. 22, 2016

(54) SEMICONDUCTOR APPARATUS AND MANUFACTURING METHOD OF THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/524,066

(22) Filed: Oct. 27, 2014

(51) Int. Cl.
| | |
|---|---|
| H01L 21/336 | (2006.01) |
| H01L 27/115 | (2006.01) |
| H01L 21/28 | (2006.01) |
| H01L 21/306 | (2006.01) |
| H01L 21/311 | (2006.01) |
| H01L 29/49 | (2006.01) |
| H01L 21/768 | (2006.01) |
| H01L 29/792 | (2006.01) |

(52) U.S. Cl.
CPC .... *H01L 27/11578* (2013.01); *H01L 21/28282* (2013.01); *H01L 21/30604* (2013.01); *H01L 21/31111* (2013.01); *H01L 29/4975* (2013.01); *H01L 21/28273* (2013.01); *H01L 21/76816* (2013.01); *H01L 27/11556* (2013.01); *H01L 27/11582* (2013.01); *H01L 29/7926* (2013.01)

(58) Field of Classification Search
CPC .............. H01L 29/7926; H01L 27/11556; H01L 27/11582; H01L 21/28273; H01L 21/76816
USPC .......................... 438/268–274; 257/623, 208
See application file for complete search history.

(56) References Cited

U.S. PATENT DOCUMENTS

| | | | | |
|---|---|---|---|---|
| 2012/0068247 A1* | 3/2012 | Lee | ................. | H01L 27/11551 257/316 |
| 2013/0134377 A1* | 5/2013 | Park | ...................... | H01L 45/06 257/4 |
| 2013/0161821 A1* | 6/2013 | Hwang | ............... | H01L 23/5283 257/773 |
| 2013/0175490 A1* | 7/2013 | Kusai | ................... | H01L 27/088 257/1 |

* cited by examiner

*Primary Examiner* — Karen Kusumakar
(74) *Attorney, Agent, or Firm* — McClure, Qualey & Rodack, LLP

(57) ABSTRACT

A semiconductor apparatus including a first stacked structure and a second stacked structure is provided. The first stacked structure and the second stacked structure are arranged along a first direction, and extended along a second direction perpendicular to the first direction. The first stacked structure includes a first operating portion and a first supporting portion. The first operating portion and the first supporting portion are alternately arranged along the second direction. A width of the first operating portion along the first direction is smaller than a width of the first supporting portion along the first direction.

16 Claims, 15 Drawing Sheets

SEMICONDUCTOR APPARATUS AND MANUFACTURING METHOD OF THE SAME

BACKGROUND

1. Technical Field

The disclosure relates in general to a semiconductor apparatus and a manufacturing method of the same, and more particularly to a semiconductor apparatus having special stacked structures and a manufacturing method of the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need and a 3D stacked memory structure is developed.

Vertical gate (VG) structures have been widely used in the 3D stacked memory structures. For high element density and large memory capacity, the stacked layers of the vertical gate structures are desired to have larger heights and smaller widths. However, such structures may easily cause bit line patterns bending, which will induce word lines bridging. Once the word line bridging happens, the whole memory block will be useless.

SUMMARY

The disclosure is directed to a semiconductor apparatus having special stacked structures and a manufacturing method of the same, which may effectively prevent bit lines from bending and word lines from bridging. Further, the semiconductor apparatus according to the disclosure provides simpler processes and lower manufacturing costs. The metal gate material may be easily stacked to reduce the loading of the memory and the power consuming, such that the memory may have better performance.

According to one embodiment, a semiconductor apparatus including a first stacked structure and a second stacked structure is provided. The first stacked structure and the second stacked structure are arranged along a first direction, and extended along a second direction perpendicular to the first direction. The first stacked structure includes a first operating portion and a first supporting portion. The first operating portion and the first supporting portion are alternately arranged along the second direction. A width of the first operating portion along the first direction is smaller than a width of the first supporting portion along the first direction.

According to another embodiment, a manufacturing method of a semiconductor is provided. The manufacturing method includes the following steps. A plurality of semiconductor layers and insulating layers is alternately stacked. The stacked semiconductor layers and insulating layers are etched to form a first stacked structure and a second stacked structure. The first stacked structure and the second stacked structure are arranged along a first direction and extended along a second direction perpendicular to the first direction. The first stacked structure includes a first operating portion and a first supporting portion. The first operating portion and the first supporting portion are alternately arranged along the second direction. A width of the first operating portion along the first direction is smaller than a width of the first supporting portion along the first direction.

Figure 1A:
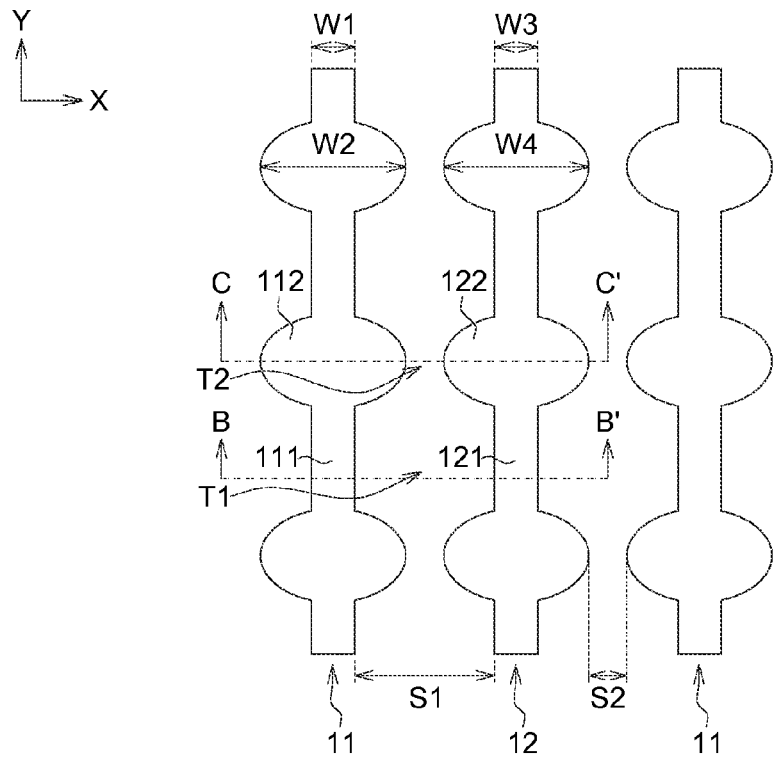
FIG. 1A to 1C, FIG. 2A to 2C, FIG. 3A to 3C, FIG. 4A to 4B, and FIG. 5A to 5B illustrate a process for manufacturing a semiconductor apparatus in one embodiment according to the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The embodiments are described in details with reference to the accompanying drawings. The identical elements of the embodiments are designated with the same reference numerals. Also, it is important to point out that the illustrations may not be necessarily drawn to scale, and that there may be other embodiments of the present disclosure which are not specifically illustrated. Thus, the specification and the drawings are regard as an illustrative sense rather than a restrictive sense.

The semiconductor apparatus according to the disclosure may include a first stacked structure and a second stacked structure. The first stacked structure and the second stacked structure are arranged along a first direction, and extended along a second direction perpendicular to the first direction. In one embodiment, the first stacked structure includes a first operating portion and a first supporting portion. The first operating portion and the first supporting portion are alternately arranged along the second direction. Besides, a width of the first operating portion along the first direction is smaller than a width of the first supporting portion along the first direction.

FIG. 1A to FIG. 5B illustrate a process for manufacturing a semiconductor apparatus in one embodiment according to the disclosure.

Figure 1B:
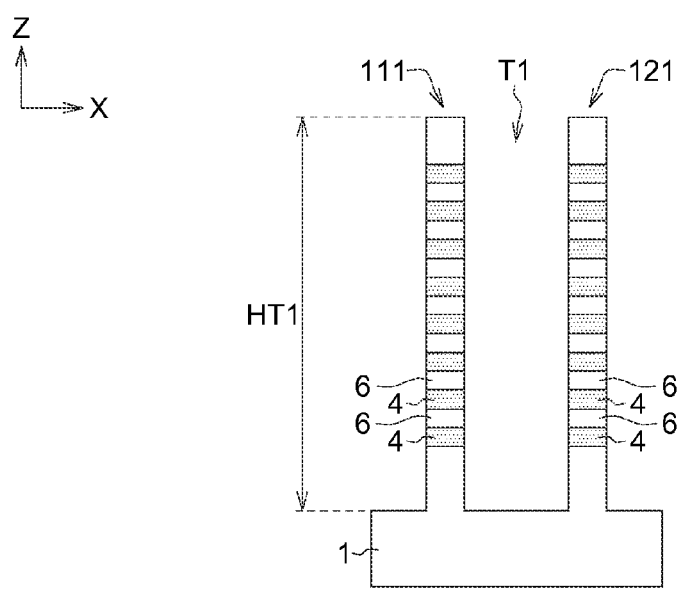

First, a plurality of semiconductor layers and insulating layers (not shown) are alternately stacked. Then, the stacked semiconductor layers and insulating layers are etched to form a first stacked structure 11 and a second stacked structure 12 as shown in FIG. 1A. FIG. 1A illustrates a transverse section view of the first stacked structure 11 and the second stacked structure 12 in one embodiment according to the disclosure. FIG. 1B and FIG. 10 illustrate a longitudinal sectional view of the structures along B-B' line and C-C' line in FIG. 1A respectively.

As shown in FIG. 1A to FIG. 10, the first stacked structure 11 and the second stacked structure 12 are arranged along a first direction (X direction). In one embodiment, the first stacked structure 11 and the second stacked structure 12 may be formed on a substrate 1, and extended along a second direction (Y direction) perpendicular to the first direction. The first stacked structure 11 and the second stacked structure 12 may include semiconductor strips 4 and insulating strips 6 stacked alternately, and the semiconductor strips 4 are separated from each other by the insulating strips 6.

The first stacked structure 11 includes a first operating portion 111 and a first supporting portion 112. The first operating portion 111 and the first supporting portion 112 are alternately arranged along the second direction. In this embodiment, a width W1 of the first operating portion 111 along the first direction is smaller than a width W2 of the first supporting portion 112 along the first direction. It should be noted that in the embodiment shown in FIG. 1A to FIG. 1C, the first operating portion 111 has a constant width (W1) along the first direction; the first supporting portion 112 may be formed as an elliptical shape, and the width of the first supporting portion 112 is defined as the max width (W2) of the first supporting portion 112, which is the width of the major axis of the ellipse along the first direction. However, the disclosure is not limited thereto. Instead, the first operating portion 111 and the first supporting portion 112 may be formed as other shapes, which will be described hereinafter.

Since the first supporting portion 112 has larger width W2 along the first direction, it would be help for supporting the first stacked structure 11 and preventing the first stacked structure 11 from bending. Besides, since the first operating portion 111 has smaller width W1 along the first direction, it would be help for better memory performance.

As shown in the figures, the second stacked structure 12 in one embodiment according to the disclosure may also include a second operating portion 121 and a second supporting portion 122. The second operating portion 121 is disposed adjacent to the first operating portion 111 along the first direction. The second supporting portion 122 is alternately arranged with the second operating portion 121 along the second direction, and disposed adjacent to the first supporting portion 112 along the first direction. A width W3 of the second operating portion 121 along the first direction is smaller than a width W4 of the second supporting portion 122 along the first direction.

Similarly, the second operating portion 121 has a constant width (W3) along the first direction; the second supporting portion 122 may be formed as an elliptical shape, and the width of the second supporting portion 122 is defined as the max width (W4) of the second supporting portion 122, which is the width of the major axis of the ellipse along the first direction. However, the disclosure is not limited thereto.

As shown in FIG. 1A, a first interval S1 is between the first operating portion 111 and the second operating portion 121, and a second interval S2 is between the first supporting portion 112 and the second supporting portion 122. The second interval S2 is smaller than the first interval S1.

Figure 1C:
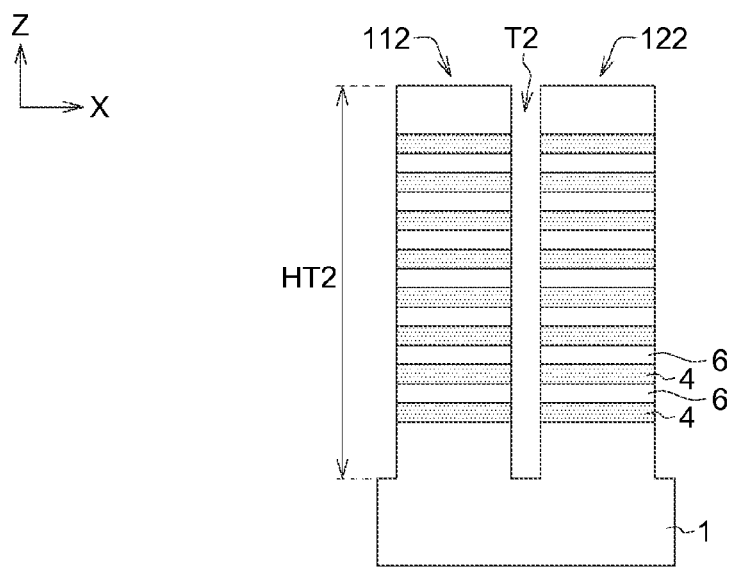

As shown in FIG. 1B and FIG. 1C, a first trench T1 is disposed between the first operating portion 111 and the second operating portion 121, and a second trench T2 is disposed between the first supporting portion 112 and the second supporting portion 122 on the longitudinal sectional view of the first stacked structure 11 and the second stacked structure 12.

Then, a dielectric structure 20 is deposited on the surfaces of the first stacked structure 11 and the second stacked structure 12, and the second trench T2 is filled with the dielectric structure 20. In one embodiment, the dielectric structure 20 may include a tunneling layer 201 and a trapping layer 202. In another embodiment, the dielectric structure 20 may include a tunneling layer 201, a trapping layer 202 and a blocking layer 203.

Figure 2A:
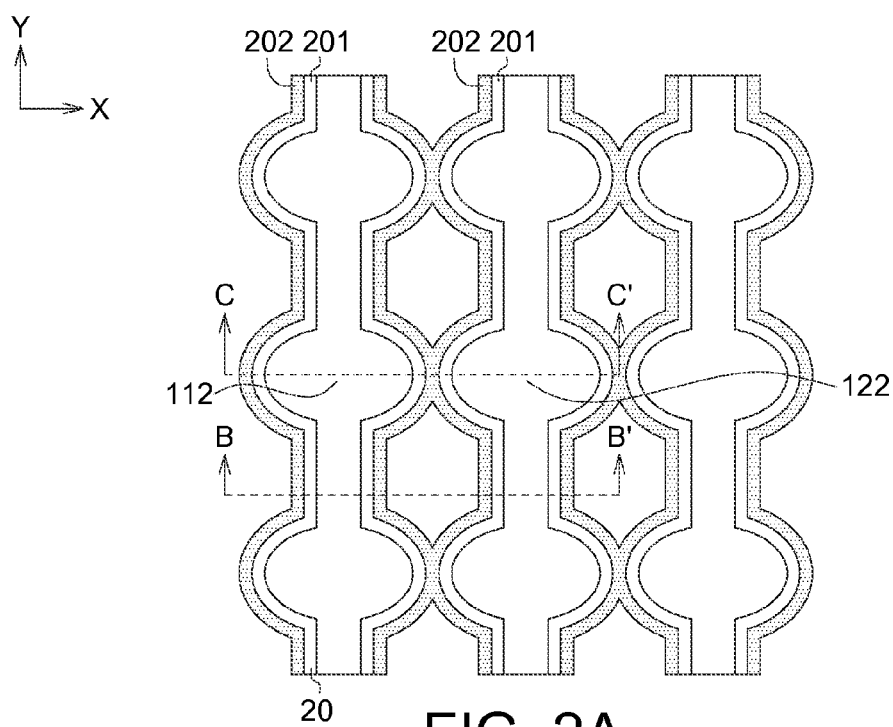
Figure 2B:
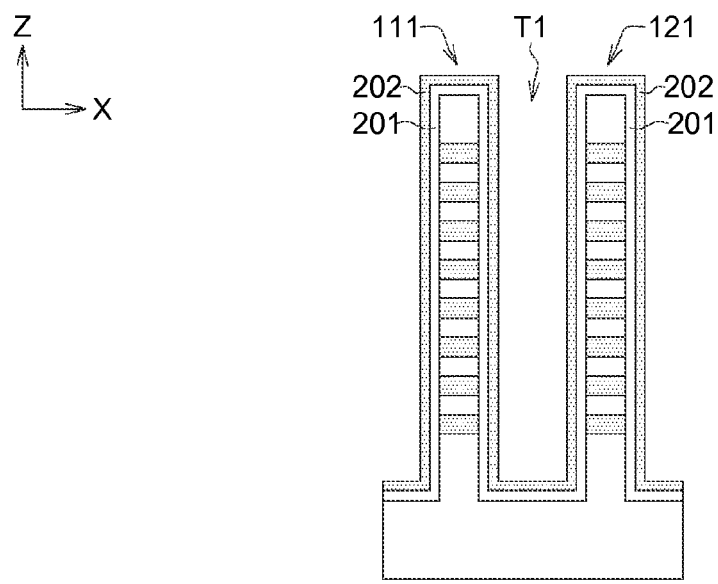
Figure 2C:
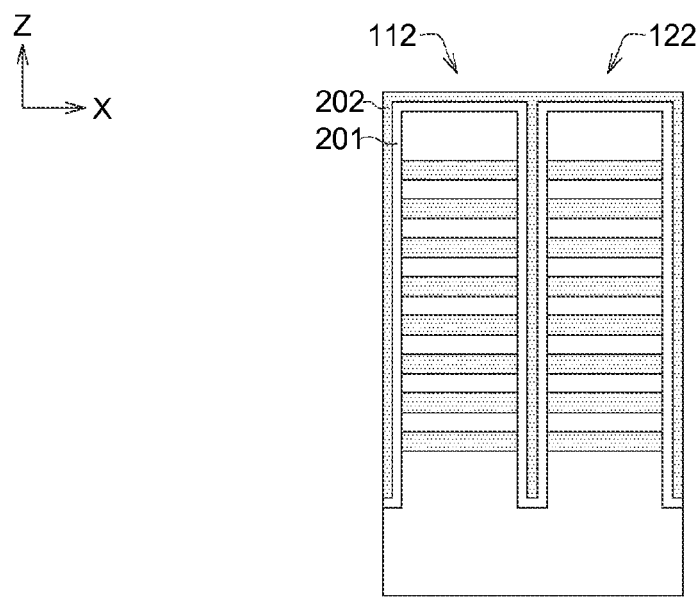
Figure 3A:
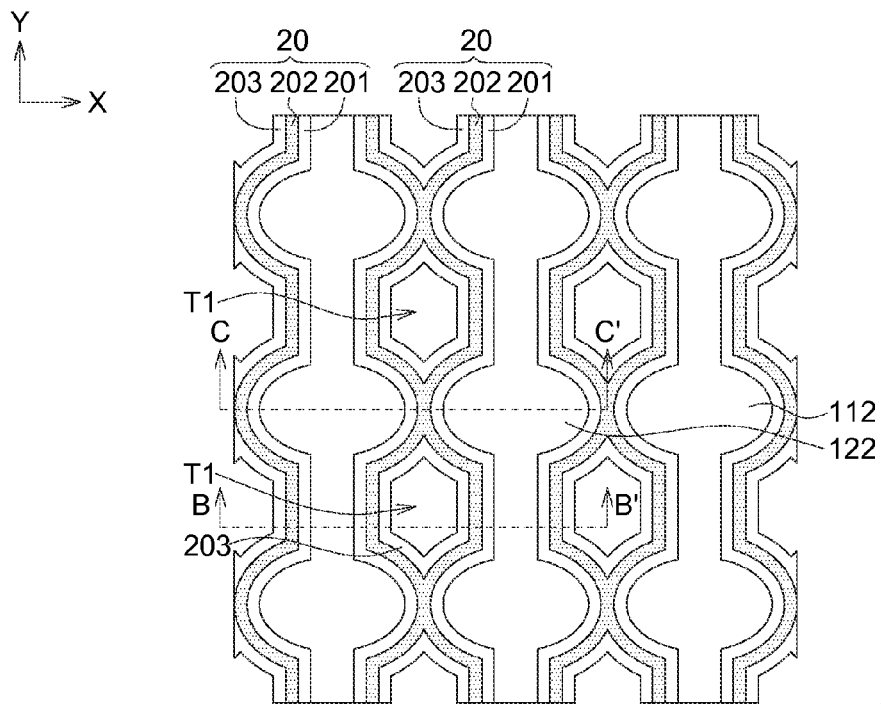
Figure 3B:
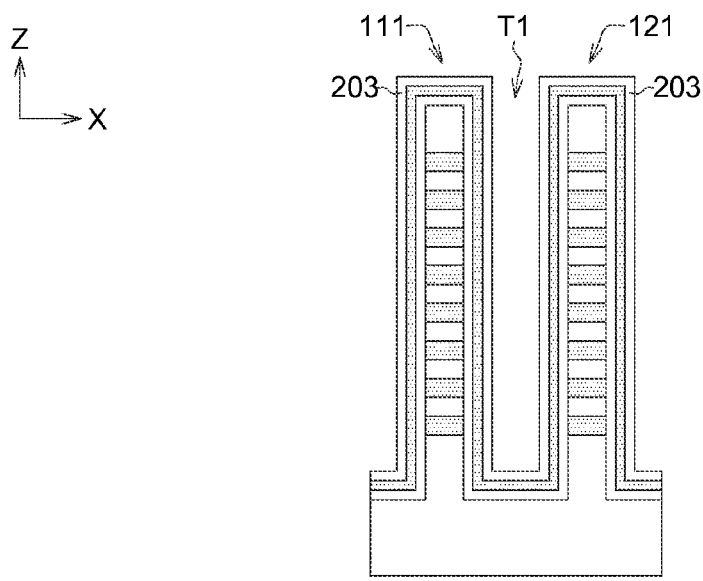
Figure 3C:
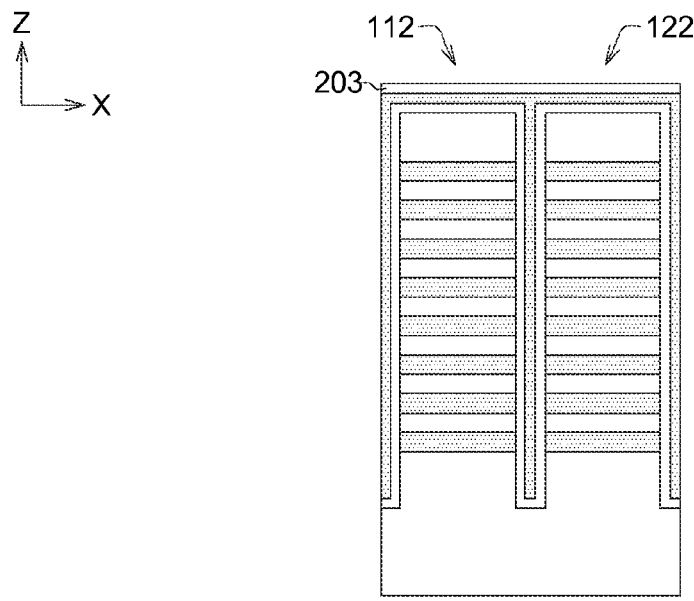

FIG. 2A and FIG. 3A illustrate a transverse section view of the semiconductor structure in one embodiment according to the disclosure. FIG. 2B and FIG. 2C illustrate a longitudinal sectional view of the structures along B-B' line and C-C' line in FIG. 2A respectively. FIG. 3B and FIG. 3C illustrate a longitudinal sectional view of the structures along B-B' line and C-C' line in FIG. 3A respectively. As shown in FIG. 2A to FIG. 2C, a tunneling layer 201 and a trapping layer 202 are sequentially deposited on the surfaces of the first stacked structure 11 and the second stacked structure 12, such that the trapping layers 202 on the surfaces of the first supporting portion 112 and the second supporting portion 122 are directly contact with each other.

In this embodiment, the second interval S2 between the first supporting portion 112 and the second supporting portion 122 is smaller than twice the total thickness of the tunneling layer 201 and the trapping layer 202. Therefore, the second trench T2 may be filled with the tunneling layer 201 and the trapping layer 202, such that the trapping layers 202 on the surfaces of the first supporting portion 112 and the second supporting portion 122 may be directly contact with each other.

As shown in FIG. 3A to FIG. 3C, a blocking layer 203 may be deposited on the surfaces of the first stacked structure 11 and the second stacked structure 12. In this embodiment, a plurality of first trenches T1 may be isolated from each other because the second trench T2 has been filled with the dielectric structure 20.

In one embodiment, the tunneling layer 201 may be such as a silicon oxide layer (O), the trapping layer 202 may be such as a silicon nitride layer (N), and the blocking layer 203 may be such as a silicon oxide layer (O). That is, the dielectric structure 20 may be a multi-layer structure, such as an ONO structure. However, the disclosure is not limited thereto. In other embodiments, the dielectric structure 20 may be such as an ONONO structure.

Figure 4A:
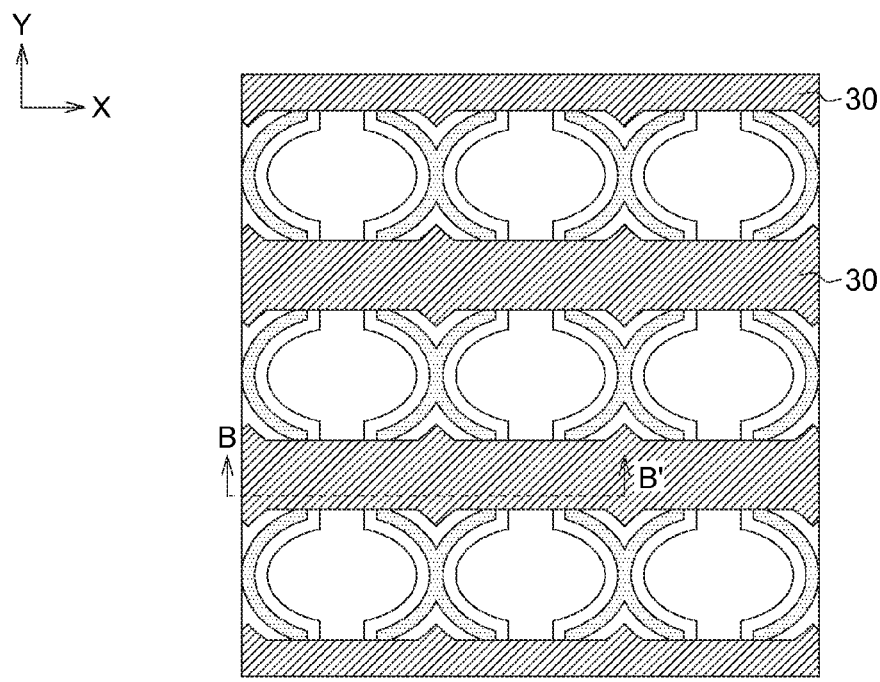
Figure 4B:
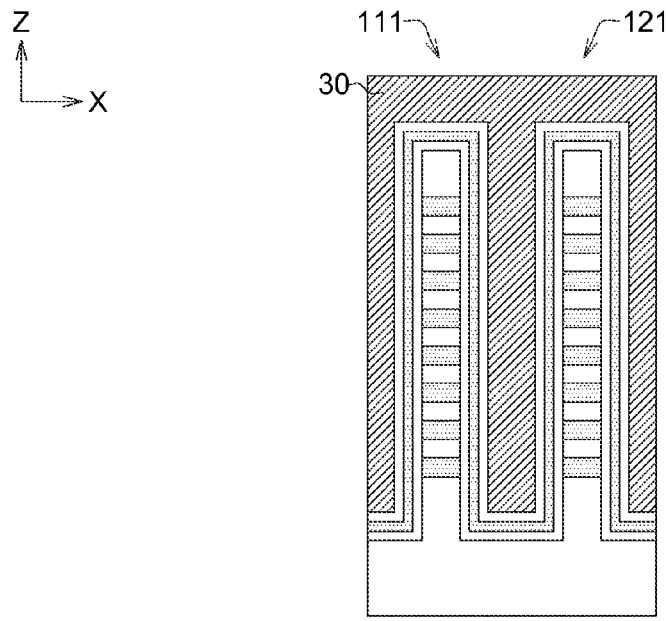

FIG. 4A illustrates a transverse section view of the semiconductor structure in one embodiment according to the disclosure. FIG. 4B illustrates a longitudinal sectional view of the structures along B-B' line in FIG. 4A. As shown in FIG. 4A and FIG. 4B, a gate structure 30 is formed on the first operating portion 111 and a second operating portion 121, and the first trench T1 is filled with the gate structure 30. In one embodiment, the gate structure 30 may include polysilicon or metal. It may be effectively to reduce the loading of the structure by selecting metal as the gate structure 30, but the selectivity of the material of the gate structure 30 still depends on the process integration and apparatus stability.

In this step, it may include depositing gate material on the first stacked structure 11 and the second stacked structure 12, and then removing the gate material on the first supporting portion 112 and the second supporting portion 122, to form the structure as shown in FIG. 4A and FIG. 4B.

Compared with the conventional process, since the conventional semiconductor stacked structures have the same widths along the first direction, that is, the trench T2 may not be filled with the dielectric structure 20. Hence, during the step of forming the gate structure 30, the gate material is also filled in the second trench T2, and the gate material filled in the trench T2 needs to be removed in the subsequent steps.

On the contrary, since the trench T2 has been filled with the dielectric structure 20 in one embodiment according to the disclosure, during the step of forming the gate structure 30, it only needs to remove the gate material on the first supporting portion 112 and the second supporting portion 122, which may effectively simplify the process and reduce the manufacturing cost.

Figure 5A:
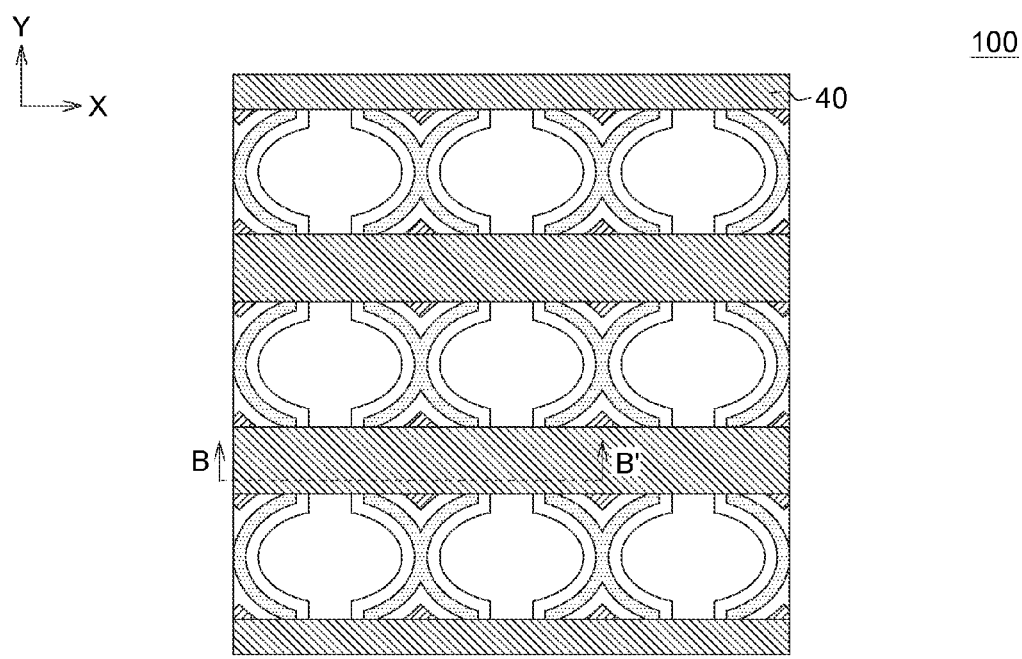
Figure 5B:
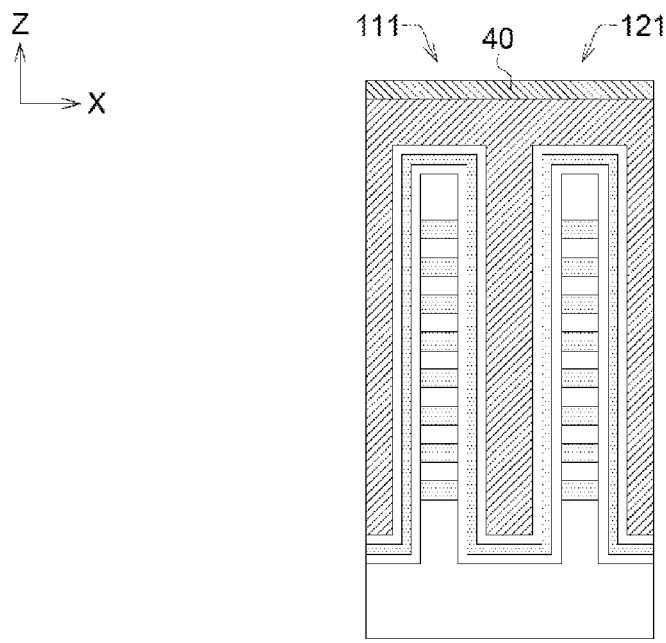

FIG. 5A illustrates a transverse section view of the semiconductor structure in one embodiment according to the disclosure. FIG. 5B illustrates a longitudinal sectional view of the structures along B-B' line in FIG. 5A. As shown in FIG. 5A and FIG. 5B, a silicide layer 40 may be deposited on the gate structure 30 to form the semiconductor apparatus 100 in one embodiment of the disclosure. In this embodiment, the silicide layer 40 may be self-aligned with the top of the gate structure 30, which may effectively lower the resistance and reduce the loading of the gate structure 30.

Figure 6A:
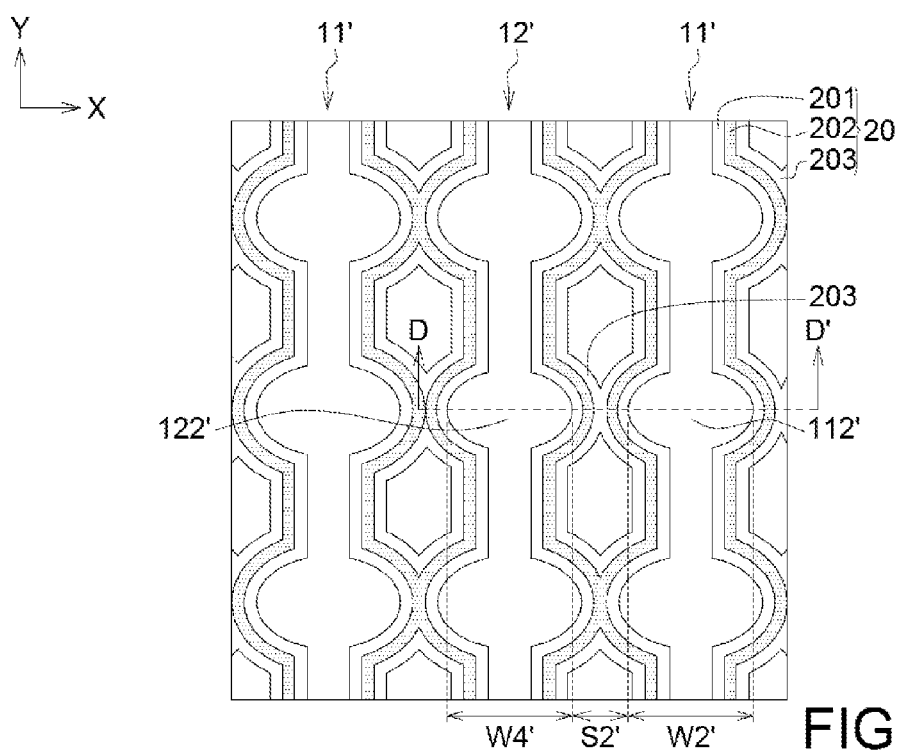
FIG. 6A illustrates a transverse section view of the semiconductor structure in another embodiment according to the disclosure.
Figure 6B:
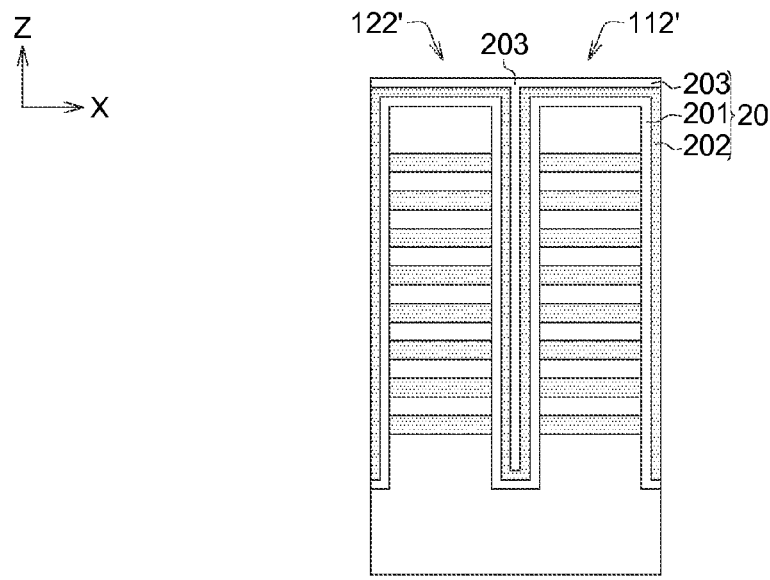
FIG. 6B illustrates a longitudinal sectional view of the structures along D-D' line in FIG. 6A.

FIG. 6A illustrates a transverse section view of the semiconductor structure in another embodiment according to the disclosure. FIG. 6B illustrates a longitudinal sectional view of the structures along D-D' line in FIG. 6A. The structure shown in FIG. 6A is similar to the structure shown in FIG. 3A. The difference between these structures is that a width W2' of the first supporting portion 112' along the first direction in FIG. 6A is smaller than the width W2 of the first supporting portion 112 along the first direction in FIG. 3A, and a width W4' of the second supporting portion 122' along the first direction in FIG. 6A is smaller than the width W4 of the second supporting portion 122 along the first direction in FIG. 3A. That is, a second interval S2' between the first supporting portion 112' and the second supporting portion 122' in FIG. 6A is larger than the second interval S2 between the first supporting portion 112 and the second supporting portion 122 in FIG. 3A.

However, as shown in FIGS. 6A and 6B, the second trench T2 between the first supporting portion 112' and the second supporting portion 122' may still be filled with the dielectric structure 20. In this embodiment, the blocking layers 203 on the surfaces of the first supporting portion 112' and the second supporting portion 122' may contact with each other. That is, although the second interval S2 between the first supporting portion 112' and the second supporting portion 122' may be larger than twice the total thickness of the tunneling layer 201 and the trapping layer 202, the second trench T2 may still be filled with the tunneling layer 201, the trapping layer 202 and the blocking layer 203.

Figure 7A:
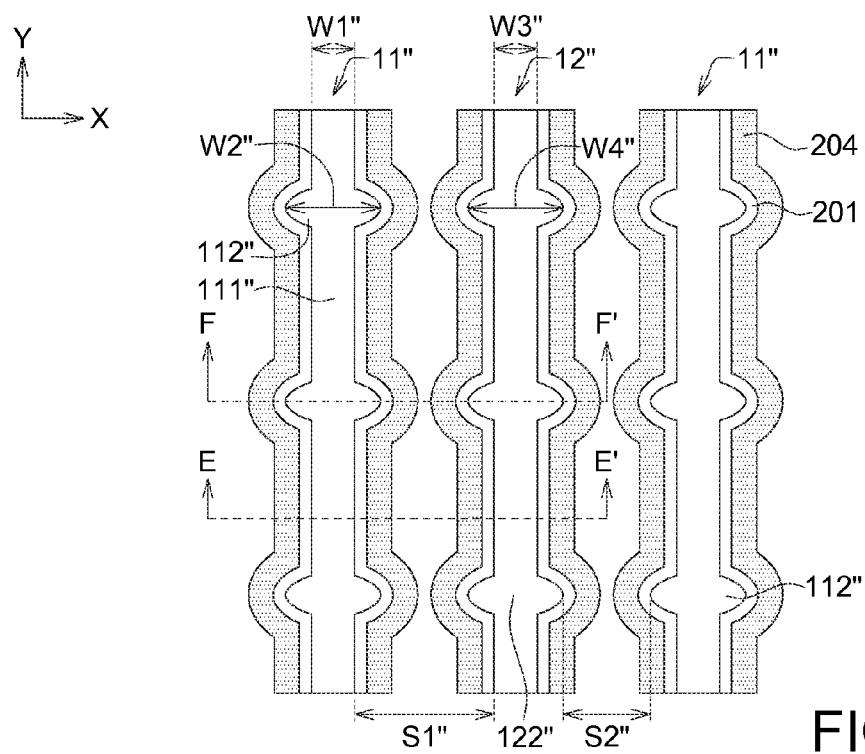
FIG. 7A to 7C, FIG. 8A to 8C, FIG. 9A to 9C, and FIG. 10A to 10C illustrate a process for manufacturing a semiconductor apparatus in another embodiment according to the disclosure.

FIG. 7A to FIG. 10C illustrate a process for manufacturing a semiconductor apparatus in another embodiment according to the disclosure. FIG. 7A illustrates a transverse section view of the semiconductor structure in another embodiment according to the disclosure. FIG. 7B and FIG. 7C illustrate a longitudinal sectional view of the structures along E-E' line and F-F' line in FIG. 7A. FIG. 8A illustrates a transverse section view of the semiconductor structure in another embodiment according to the disclosure. FIG. 8B and FIG. 8C illustrate a longitudinal sectional view of the structures along E-E' line and F-F' line in FIG. 8A. In this embodiment, a first interval S1" is between the first operating portion 111" of the first stacked structure 11" and the second operating portion 121" of the second stacked structure 12", and a second interval S2" is between the first supporting portion 112" of the first stacked structure 11" and the second supporting portion 122" of the second stacked structure 12". The first interval S1" and the second interval S2" are larger than the first interval S1 and the second interval S2 in FIG. 1A respectively.

Figure 7B:
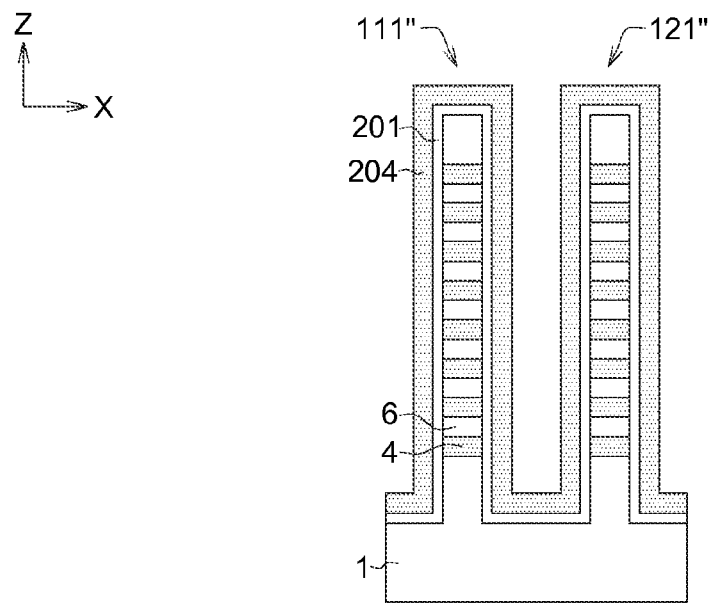
Figure 7C:
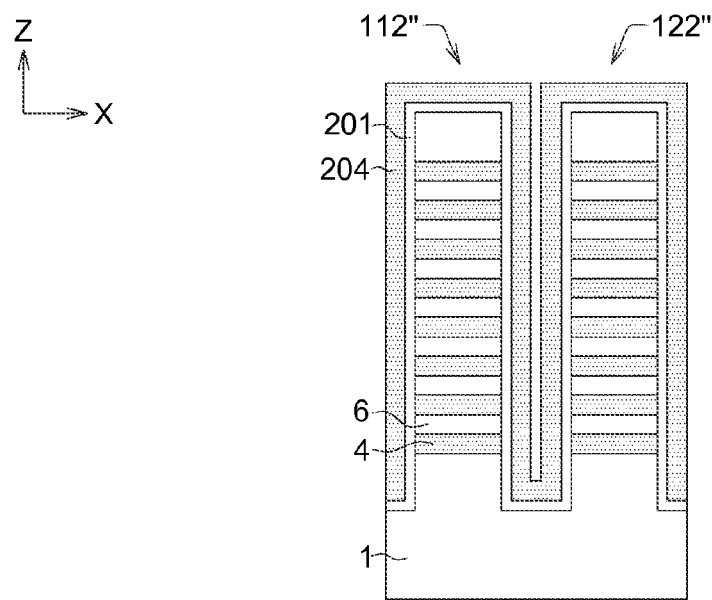

As shown in FIG. 7A to FIG. 7C, a tunneling layer 201 and a trapping layer 204 are sequentially deposited on the surfaces of the first stacked structure 11" and the second stacked structure 12". In this embodiment, a thickness of the trapping layer 204 is larger than a predetermined thickness (and the predetermined thinness is such as the thickness of the trapping layer 202 shown in FIG. 2A to 2C). For example, the predetermined thickness may be 45 Å and the thickness of the trapping layer 204 may be 100 Å.

Figure 8A:
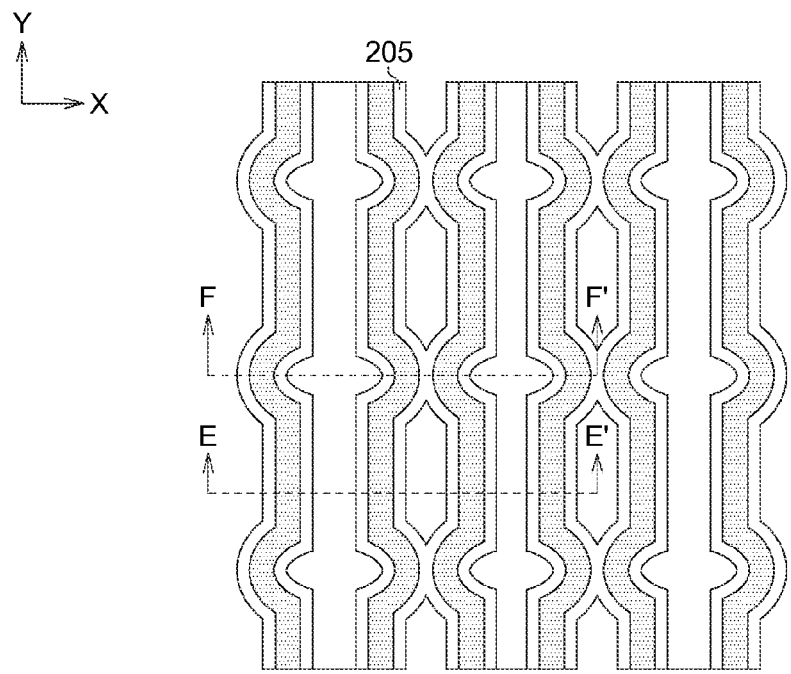
Figure 8B:
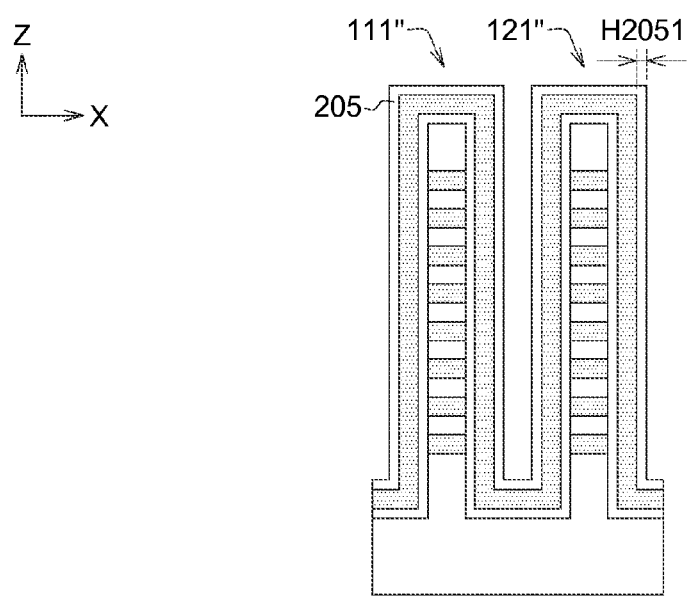
Figure 8C:
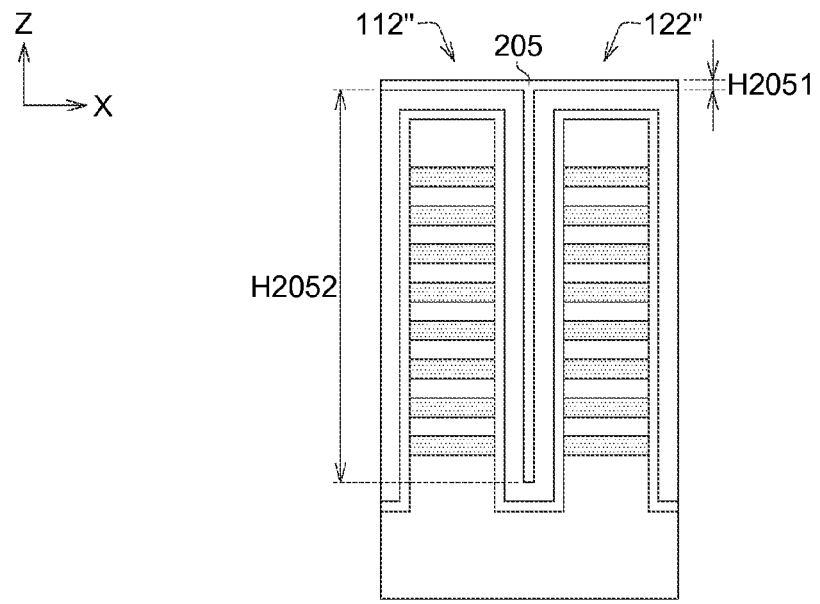

Then, a dummy blocking layer 205 is deposited on the surfaces of the first stacked structure 11" and the second stacked structure 12" as shown in FIG. 8A to FIG. 8C, such that the dummy blocking layers 205 on the surfaces of the first supporting portion 112" and the second supporting portion 122" may be contact with each other.

In one embodiment, the step of depositing the dummy blocking layer 205 may include depositing a polysilicon material, and then executing a thermal oxidation process to oxidize the polysilicon material. Besides, the trapping layer 204 may be used as a stopping layer of the thermal oxidation process, such that the polysilicon material may be converted to the dummy blocking layer 205.

Figure 9A:
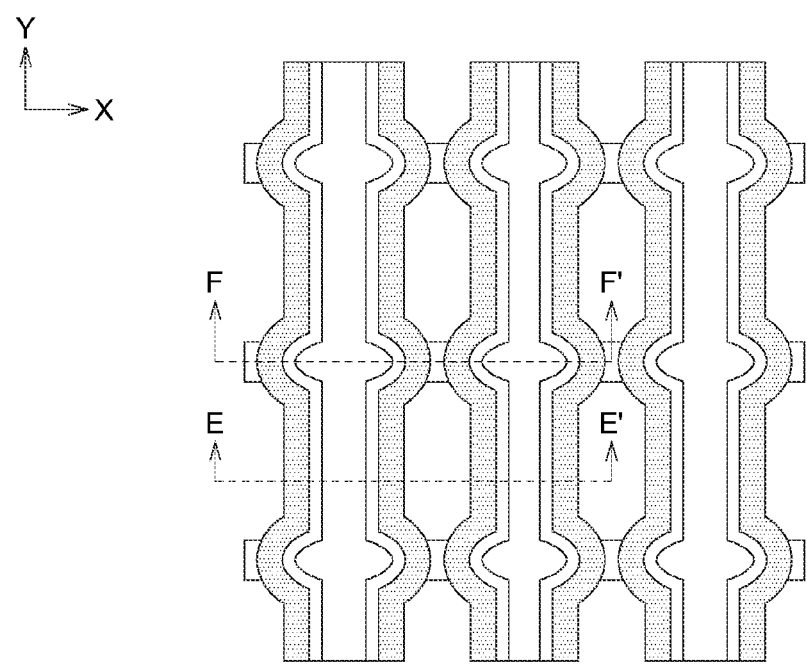
Figure 9B:
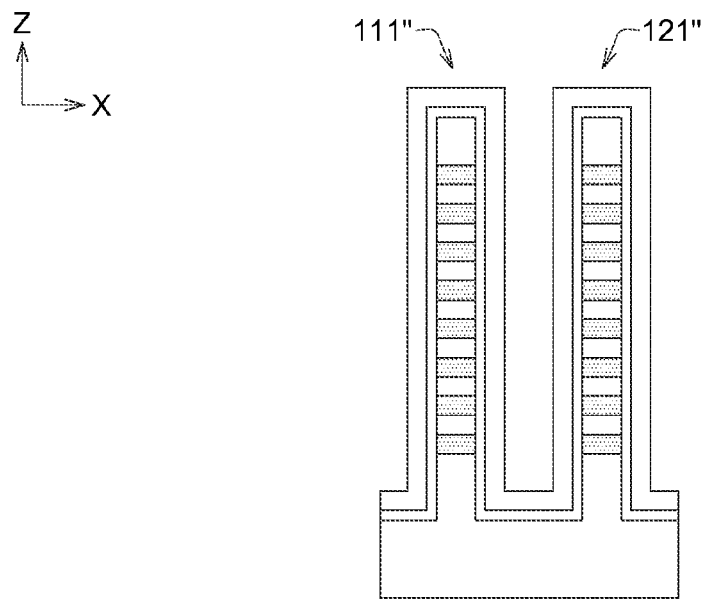
Figure 9C:
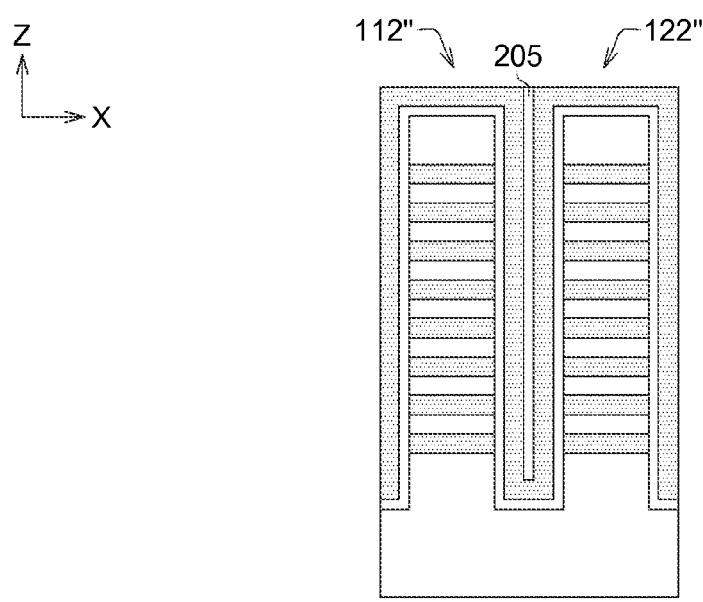

FIG. 9A illustrates a transverse section view of the semiconductor structure in another embodiment according to the disclosure. FIG. 9B and FIG. 9C illustrate a longitudinal sectional view of the structures along E-E' line and F-F' line in FIG. 9A. As shown in FIG. 9A to 9C, the dummy blocking layer 205 on the surfaces of the first operating portion 111" and the second operating portion 121" is removed.

In one embodiment, for example, an isotropic etching process is executed to remove the dummy blocking layer 205 on the surfaces of the first operating portion 111" and the second operating portion 121". The isotropic etching process may be executed by hydrogen fluoride (HF). Besides, most of the dummy blocking layer 205 between the first supporting portion 112" and the second supporting portion 122" may be remained and contact with each other, since the thickness of the dummy blocking layer 205 deposited between the first supporting portion 112" and the second supporting portion 122" (such as the thickness H2052 along the Z direction as shown in FIG. 8C) is much larger than the thickness of the dummy blocking layer 205 deposited on other portions (such as the thickness H2051 along the X direction as shown in FIG. 8B).

Figure 10A:
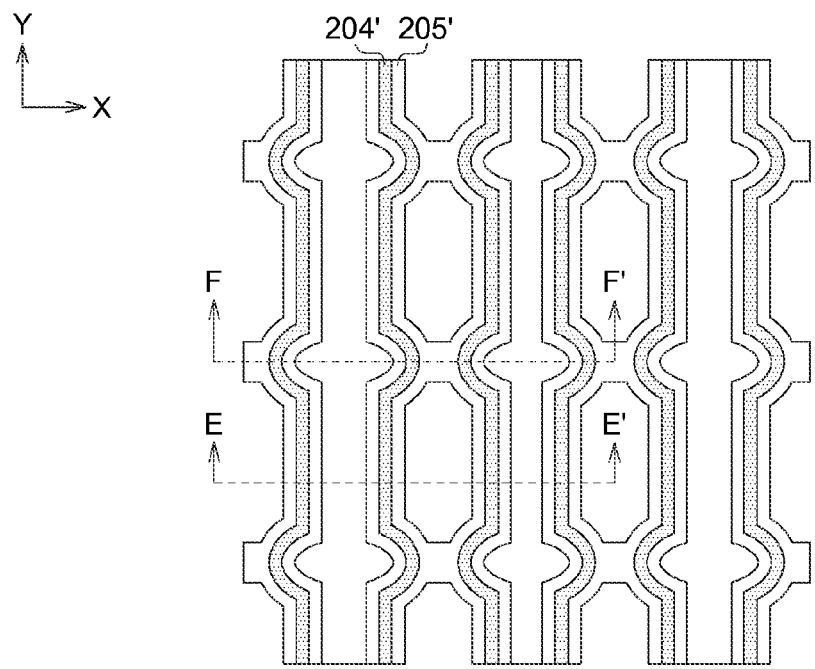
Figure 10B:
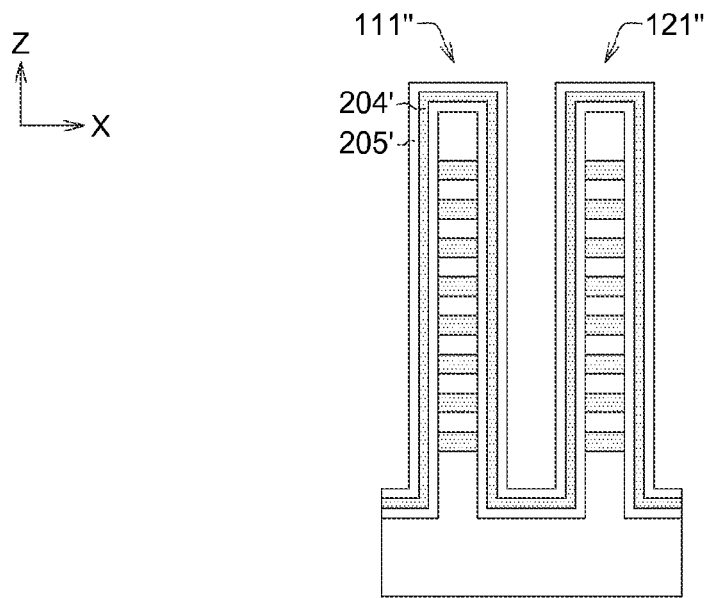
Figure 10C:
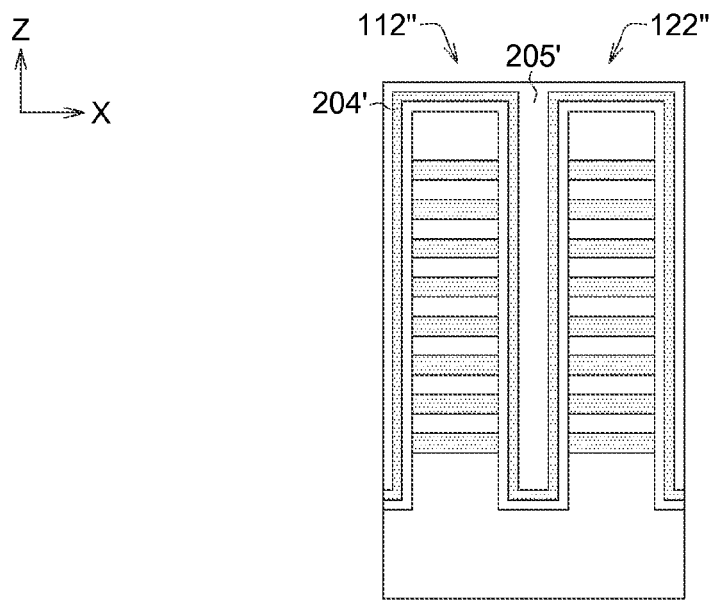

FIG. 10A illustrates a transverse section view of the semiconductor structure in another embodiment according to the disclosure. FIG. 10B and FIG. 10C illustrate a longitudinal sectional view of the structures along E-E' line and F-F' line in FIG. 10A. As shown in FIG. 10A to FIG. 10C, a portion of the trapping layer 204 is converted to the blocking layer 205', and the trapping layer 204' is remained. In this embodiment, a thermal process may be executed to convert a portion of the trapping layer 204 to the blocking layer 205'. Then, the process steps similar to the steps shown in FIG. 4A to FIG. 5B may be executed.

Although the first operating portion has a constant width along the first direction, the first supporting portion is formed as an elliptical shape, and a width of the second supporting portion 122 is defined as the max width of the second supporting portion 122 in the embodiments mentioned above, however, the disclosure is not limited thereto.

Figure 11A:
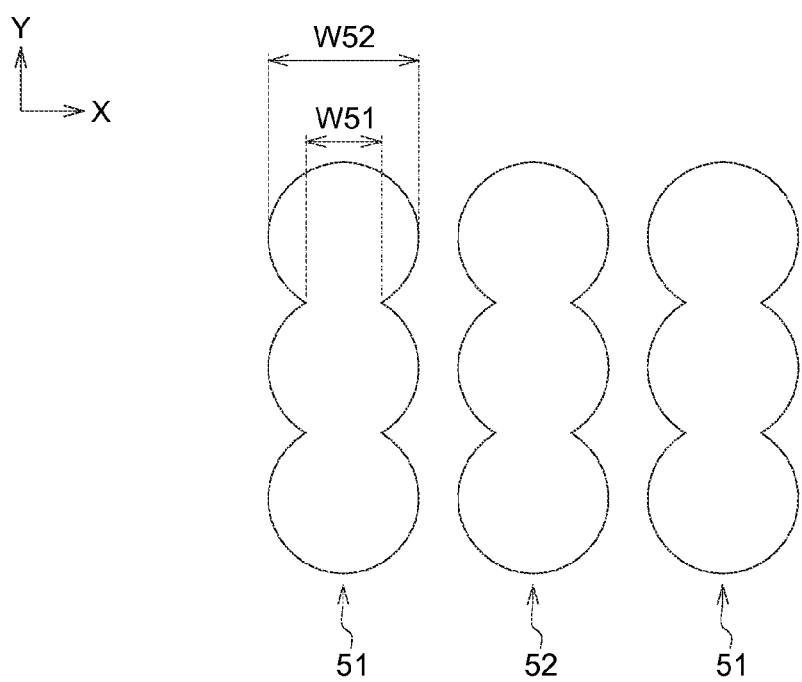
FIG. 11A and FIG. 11B illustrate a transverse section view of the first stacked structure and the second stacked structure in another embodiment according to the disclosure.
Figure 11B:
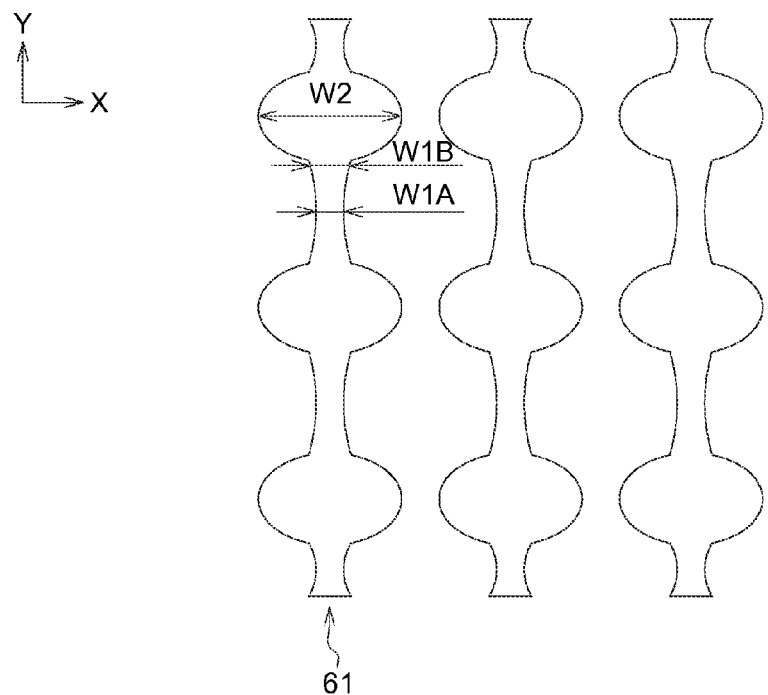

FIG. 11A and FIG. 11B illustrate a transverse section view of the first stacked structure and the second stacked structure in another embodiment according to the disclosure. As shown in FIG. 11A, the first stacked structure 51 and the second stacked structure 52 may be formed as a plurality of ellipses, wherein a width of the first operating portion is W51, a width of the first supporting portion is W52, and the width W51 is smaller than the width W52. As shown in FIG. 11B, the first operating portion of the first stacked structure 61 may include two curved sidewalls, such that the first operating portion has two different widths W1A and W1B on the first direction. In this embodiment, the width W1A is smaller than the width W1B.

Figure 12A:
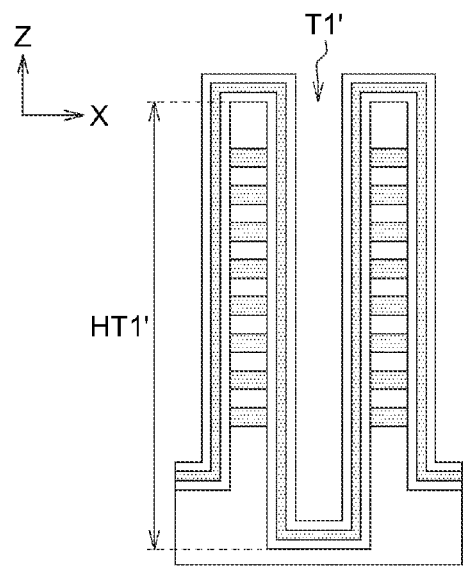
FIG. 12A and FIG. 12B illustrate a longitudinal section view of the first stacked structure and the second stacked structure in another embodiment according to the disclosure.
Figure 12B:
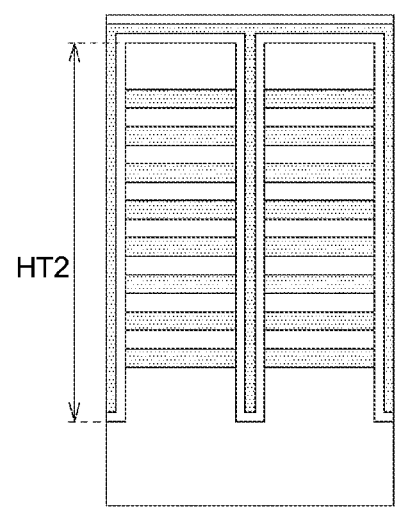

FIG. 12A and FIG. 12B illustrate a longitudinal section view of the first stacked structure and the second stacked structure in another embodiment according to the disclosure. In this embodiment, a depth HT1' of the first trench T1' may be larger than a depth HT2 of the second trench T2. Since the first interval S1 between the first operating portion 111 and the second operating portion 121 is larger than the second interval S2 between the first supporting portion 112 and the second supporting portion 122, that is, the cross-section area of the first trench T1' may be larger than the cross-section area of the second trench T2, and the etching process may be isotropic, such that the depth HT1' of the first trench T1' may be larger than the depth HT2 of the second trench T2.

According to the embodiments above, the semiconductor apparatus having the first operating portion and the first supporting portion (or the second operating portion and the second supporting portion) with different widths according to the disclosure may effectively prevent the first stacked structure (or the second stacked structure) from bending and word lines from bridging. Further, the semiconductor apparatus according to the disclosure provide simpler processes and lower manufacturing costs. The metal gate material may be easily stacked to reduce the loading of the memory and the power consuming, such that the memory may have better performance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor apparatus comprising a first stacked structure and a second stacked structure arranged along a first direction and extended along a second direction perpendicular to the first direction, and a dielectric structure disposed on surfaces of the first stacked structure and the second stacked structure, the first stacked structure comprising:
   a first operating portion; and
   a first supporting portion alternately arranged with the first operating portion along the second direction; and
   the second stacked structure comprising:
   a second operating portion disposed adjacent to the first operating portion along the first direction; and
   a second supporting portion alternately arranged with the second operating portion along the second direction, and disposed adjacent to the first supporting portion along the first direction;
   wherein
   a width of the first operating portion along the first direction is smaller than a width of the first supporting portion along the first direction;
   a width of the second operating portion along the first direction is smaller than a width of the second supporting portion along the first direction;
   a first trench is disposed between the first operating portion and the second operating portion, and a second trench is disposed between the first supporting portion and the second supporting portion on the longitudinal sectional view of the first stacked structure and the second stacked structure; and
   the dielectric structure is filled in the second trench and is a multi-layer structure comprising a tunneling layer and a trapping layer.

2. A semiconductor apparatus comprising a first stacked structure and a second stacked structure arranged along a first direction and extended along a second direction perpendicular to the first direction, the first stacked structure comprising:
   a first operating portion; and
   a first supporting portion alternately arranged with the first operating portion along the second direction; and
   the second stacked structure comprising:
   a second operating portion disposed adjacent to the first operating portion along the first direction; and
   a second supporting portion alternately arranged with the second operating portion along the second direction, and disposed adjacent to the first supporting portion along the first direction;
   wherein
   a width of the first operating portion along the first direction is smaller than a width of the first supporting portion along the first direction;
   a width of the second operating portion along the first direction is smaller than a width of the second supporting portion along the first direction;
   a first trench is disposed between the first operating portion and the second operating portion, and a second trench is disposed between the first supporting portion and the second supporting portion on the longitudinal sectional view of the first stacked structure and the second stacked structure; and
   a depth of the first trench is larger than a depth of the second trench.

3. The semiconductor apparatus according to claim 1, wherein the multi-layer structure further comprises a blocking layer, and the tunneling layer, the trapping layer and the blocking layer are sequentially formed on the surfaces of the first stacked structure and the second stacked structure.

4. The semiconductor apparatus according to claim 1, wherein a first interval is between the first operating portion and the second operating portion, a second interval is between the first supporting portion and the second supporting portion, and the second interval is smaller than the first interval.

5. The semiconductor apparatus according to claim 4, wherein the second interval is smaller than twice the total thickness of the tunneling layer and the trapping layer.

6. The semiconductor apparatus according to claim 1, further comprising a gate structure disposed on the first operating portion and the second operating portion and filled with the first trench.

7. The semiconductor apparatus according to claim 1, wherein the first operating portion comprises two curved sidewalls, such that the first operating portion has two different widths on the first direction.

8. A manufacturing method of a semiconductor, comprising:
   alternately stacking a plurality of semiconductor layers and insulating layers; and
   etching the stacked semiconductor layers and insulating layers to form a first stacked structure and a second stacked structure, wherein the first stacked structure and the second stacked structure are arranged along a first direction and extended along a second direction perpendicular to the first direction, the first stacked structure comprising:
   a first operating portion; and
   a first supporting portion alternately arranged with the first operating portion along the second direction;
   wherein a width of the first operating portion along the first direction is smaller than a width of the first supporting portion along the first direction.

9. The manufacturing method according to claim 8, wherein second stacked structure comprising:
- a second operating portion disposed adjacent to the first operating portion along the first direction; and
- a second supporting portion alternately arranged with the second operating portion along the second direction, and disposed adjacent to the first supporting portion along the first direction;
- a width of the second operating portion along the first direction is smaller than a width of the second supporting portion along the first direction.

10. The manufacturing method according to claim 9, wherein a first trench is disposed between the first operating portion and the second operating portion, and a second trench is disposed between the first supporting portion and the second supporting portion on the longitudinal sectional view of the first stacked structure and the second stacked structure.

11. The manufacturing method according to claim 10, further comprising:
- depositing a dielectric structure on the surfaces of the first stacked structure and the second stacked structure, wherein the dielectric structure is filled in the second trench.

12. The manufacturing method according to claim 11, wherein the step of depositing the dielectric layer comprises:
- sequentially depositing a tunneling layer and a trapping layer on the surfaces of the first stacked structure and the second stacked structure, such that the trapping layers on the surfaces of the first supporting portion and the second supporting portion directly contact with each other.

13. The manufacturing method according to claim 11, wherein the step of depositing the dielectric layer comprises:
- sequentially depositing a tunneling layer, a trapping layer and a blocking layer on the surfaces of the first stacked structure and the second stacked structure, such that the blocking layers on the surfaces of the first supporting portion and the second supporting portion directly contact with each other.

14. The manufacturing method according to claim 13, further comprising:
- removing the blocking layers on the surfaces of the first operating layer and the second operating layer;
- converting a portion of the trapping layer to the blocking layer.

15. The manufacturing method according to claim 11, further comprising:
- Forming a gate structure on the first operating portion and the second operating portion, wherein the gate structure is filled in the first trench.

16. The manufacturing method according to claim 15, further comprising:
- forming a silicide layer on the gate structure.

\* \* \* \* \*